(12) United States Patent
Kwag et al.

(10) Patent No.: US 10,043,838 B2
(45) Date of Patent: Aug. 7, 2018

(54) IMAGE SENSOR

(71) Applicant: SK hynix Inc., Gyeonggi-do (KR)

(72) Inventors: Pyong-Su Kwag, Gyeonggi-do (KR);
Yun-Hui Yang, Gyeonggi-do (KR);
Young-Jun Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 40 days.

(21) Appl. No.: 15/215,770

(22) Filed: Jul. 21, 2016

(65) Prior Publication Data

US 2017/0287959 A1   Oct. 5, 2017

(30) Foreign Application Priority Data

Mar. 29, 2016 (KR) .................. 10-2016-0037391

(51) Int. Cl.
*H01L 27/146* (2006.01)
*H04N 5/378* (2011.01)

(52) U.S. Cl.
CPC .... *H01L 27/14616* (2013.01); *H01L 27/1463* (2013.01); *H01L 27/14621* (2013.01); *H01L 27/14627* (2013.01); *H01L 27/14645* (2013.01); *H04N 5/378* (2013.01)

(58) Field of Classification Search
CPC .......... H01L 27/1464; H01L 27/14612; H01L 27/14614; H01L 27/14616; H01L 27/1461
See application file for complete search history.

(56) References Cited

U.S. PATENT DOCUMENTS

| | | | |
|---|---|---|---|
| 9,040,343 B2 | 5/2015 | Enomoto et al. | |
| 9,219,093 B1* | 12/2015 | Vora | H01L 27/14634 |
| 2009/0303371 A1* | 12/2009 | Watanabe | H01L 27/14603 |
| | | | 348/311 |
| 2014/0347538 A1* | 11/2014 | Toda | H01L 27/14603 |
| | | | 348/308 |
| 2015/0035028 A1* | 2/2015 | Fan | H01L 27/14623 |
| | | | 257/292 |

* cited by examiner

*Primary Examiner* — Matthew Reames
*Assistant Examiner* — John Bodnar
(74) *Attorney, Agent, or Firm* — IP & T Group LLP (57) ABSTRACT

An image sensor may include: a photoelectric conversion element including a second conductive layer formed over a first conductive layer; an insulating layer and a third conductive layer which are sequentially formed over the second conductive layer; an opening exposing the second conductive layer through the third conductive layer and the insulating layer; a channel layer formed along the surface of the opening, and including first and second channel layers which are coupled to each other while having different conductivity types; and a transfer gate formed over the channel layer to fill the opening, and partially formed over the third conductive layer.

15 Claims, 9 Drawing Sheets

IMAGE SENSOR

CROSS-REFERENCE TO RELATED APPLICATIONS

The present application claims priority under 35 U.S.C § 119(a) to Korean Patent Application No. 10-2016-0037391, filed on Mar. 29, 2016, which is incorporated herein by reference in its entirety.

BACKGROUND

Exemplary embodiments of the present invention relate generally to a technology for fabricating a semiconductor device and, more particularly, to an image sensor and a method for fabricating the same.

An image sensor converts an optical image into an electrical signal. Recently, due to the rapid development of the computer and communication industries, demand for an image sensor with improved performance has increased for various devices, such as digital cameras, camcorders, PCS (Personal Communication System), game machines, security cameras, medical micro-cameras, and robots.

SUMMARY

Various embodiments are directed to an improved image sensor and a method for fabricating the same.

In an embodiment, an image sensor may include: a photoelectric conversion element including a second conductive layer formed over a first conductive layer; an insulating layer and a third conductive layer which are sequentially formed over the second conductive layer; an opening exposing the second conductive layer through the third conductive layer and the insulating layer; a channel layer formed along the surface of the opening, and including first and second channel layers which are coupled to each other while having different conductivity types; and a transfer gate formed over the channel layer to fill the opening, and partially formed over the third conductive layer.

The image sensor may further include a boosting capacitor which includes the third conductive layer and the transfer gate formed over the third conductive layer to overlap the third conductive layer.

The first channel layer may be in contact with the second conductive layer, and the second channel layer may be in contact with the insulating layer and the third conductive layer. The first channel layer may have the same conductivity type as the second conductive layer. The first and second channel layers may include the same material. The first channel layer may include P-type polysilicon. The second channel layer may include intrinsic polysilicon or N-type polysilicon. The bottom surface of the opening may be more adjacent to the interface between the first conductive layer and the second conductive layer than the interface between the insulating layer and the second conductive layer. The third conductive layer may be formed in a plate shape, and may have an area corresponding to the photoelectric conversion element. The first conductive layer may have a different conductivity type from the second conductive layer, and the third conductive layer may have the same conductivity type as the second conductive layer. The first and second conductive layers may include an impurity region formed in a substrate or an epitaxial layer formed over the substrate.

In an embodiment, an image sensor may include: a photoelectric conversion element suitable for generating photocharge in response to incident light; and a transfer transistor suitable for transferring the photocharge to a floating diffusion. The transfer transistor may include first and second transistors coupled in series between the photoelectric conversion element and the floating diffusion, and having different threshold voltages from each other.

The transfer transistor may further include a boosting capacitor having a first terminal coupled to the gate of the second transistor and a second terminal coupled to the floating diffusion. The boosting capacitor may include a parasitic capacitor between the gate of the second transistor and the floating diffusion coupled to the drain of the second transistor. The gate of the first transistor, the gate of the second transistor and one electrode of the boosting capacitor may be coupled to each other.

The first and second transistors may have the same conductivity type. A first channel layer of the first transistor may have a different conductivity type from a second channel layer of the second transistor. The first transistor may be coupled between the photoelectric conversion element and the second transistor, and operated in an enhancement mode. The second transistor may be coupled between the first transistor and the floating diffusion, and operated in an enhancement mode or depletion mode. The second transistor may include a thin film transistor.

In an embodiment, a method for fabricating an image sensor may include: forming a photoelectric conversion element including a second conductive layer formed over a first conductive layer; sequentially forming an insulating layer and a third conductive layer over the photoelectric conversion layer; forming an opening to expose the second conductive layer by selectively etching the third conductive layer and the insulating layer; forming a channel layer along the surface of the resultant structure including the opening, the channel layer including first and second channel layers which are coupled to each other while having different conductivity types; and forming a transfer gate over the channel layer, the transfer gate filling the opening and partially overlapping the third conductive layer.

The forming of the opening may include: etching a part of the second conductive layer such that the bottom surface of the opening is more adjacent to the interface between the first conductive layer and the second conductive layer than the interface between the insulating layer and the second conductive layer, after the third conductive layer and the insulating layer are etched. The forming of the channel layer may include: forming a pre-channel layer along the surface of the resultant structure including the opening, the pre-channel layer having the same conductivity type as the first channel layer; forming a victim layer on the pre-channel layer, such that the victim layer gap-fills a part of the opening; forming a second channel layer by performing counter doping on the pre-channel layer exposed by the victim layer; and removing the victim layer. The forming of the channel layer may include: forming a pre-channel layer along the surface of the resultant structure including the opening; and forming the first channel layer by performing an anneal process to diffuse an impurity of the second conductive layer into the pre-channel layer which is in contact with the second conductive layer. The forming of the channel layer may further include: forming a victim layer on the pre-channel layer so as to cover the first channel layer; forming the second channel layer by performing an impurity doping process on the pre-channel layer exposed by the victim layer; and removing the victim layer. The first channel layer may be formed to be in contact with the second conductive layer, and the second channel layer may be formed to be in contact with the insulating layer and the third conductive layer. The first channel layer may have the same conductivity type as the second conductivity type. The first and second channel layers may include the same material. The first channel layer may include P-type polysilicon. The second channel layer may include intrinsic polysilicon or N-type polysilicon. The first conductive layer may have a different conductivity type from the second conductive layer, and the third conductive layer may have the same conductivity type as the second conductive layer.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Hereinafter, various embodiments of the disclosed technology are described below in detail with reference to the accompanying drawings.

The drawings may not be necessarily to scale and in some instances, proportions of at least some of structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

The following embodiments provide an improved image sensor and a method for fabricating the same. The improved image sensor may indicate an image sensor capable of providing a high-pixel image. In order to provide a high-pixel image, an image sensor is required to have a large number of unit pixels integrated in a limited area. Each of the unit pixels in the image sensor, according to an embodiment of the present invention may include a transfer transistor. The transfer transistor may have a vertical transfer gate. The transfer transistor and a photoelectric conversion element may be stacked.

Figure 1:
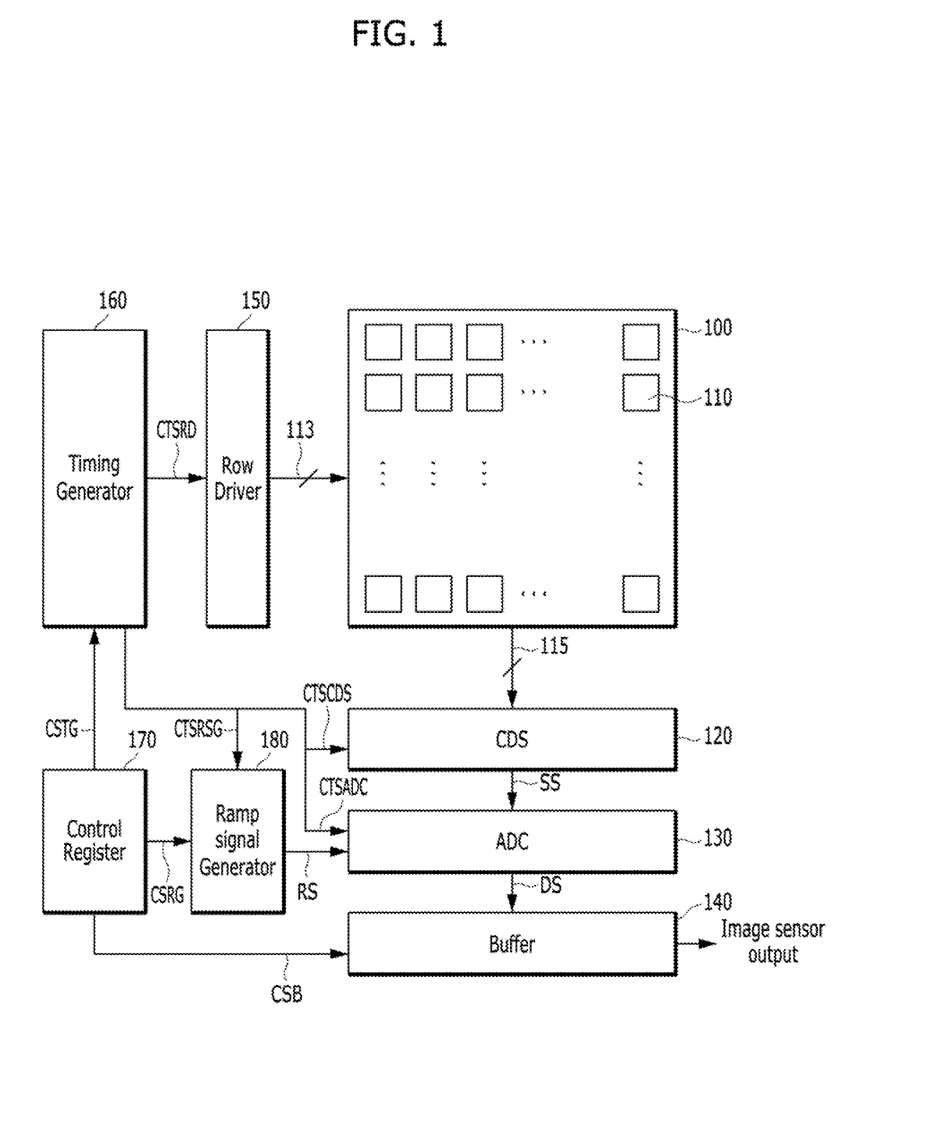
FIG. 1 is a block diagram schematically illustrating an image sensor, according to an embodiment of the present invention.

FIG. 1 schematically illustrates an image sensor, according to an embodiment of the present invention.

As illustrated in FIG. 1, the image sensor may include a pixel array 100, a correlated double sampler (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control timing signals CTSRD, CTSCDS, CTSADC and CTSRSG for controlling the row driver 150, the CDS 120, the ADC 130, and the ramp signal generator 180, respectively. The control register 170 may generate one or more control signals CSRG, CSTG, and CSB for controlling the ramp signal generator 180, the timing generator 160, and the buffer 140, respectively.

The row driver 150 may drive the pixel array 100 row by row. For example, the row driver 150 may generate a select signal for selecting any one row line of a plurality of row lines 113. Each of the unit pixels 110 may sense incident light and output an image reset signal IRS and an image signal IS to the CDS 120 through a column line 115. The CDS 120 may perform sampling of the pixel output in response to the image reset signal and the image signal.

The ADC 130 may compare a ramp signal RS outputted from the ramp signal generator 180 with a sampling signal SS outputted from the CDS 120, and output a comparison signal to the buffer 140. According to a dock signal provided from the timing generator 160, the ADC 130 may count the level transition time of the comparison signal and output the count value to the buffer 140. The ramp signal generator 180 may operate under control of the timing generator 160.

The buffer 140 may store a plurality of digital signals DS outputted from the ADC 130. The buffer 140 also may sense and amplify the digital signals DS. Thus, the buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

In order to provide a high-pixel image, the number of unit pixels 110 integrated in a pixel array 100 needs to be increased. That is, a larger number of unit pixels 110 need to be integrated within a limited area. For this structure, the physical size of the unit pixel 110 needs to be reduced. However, the image sensor still operates based on pixel signals generated through each of the unit pixels in response to incident light. Thus, when the physical size of the unit pixel 110 is reduced, the characteristics of the unit pixel 110 may be degraded.

To prevent degradation in the characteristics of the unit pixel 110 due to high integration, a three-dimensional (3D) pixel structure has been proposed. The 3D pixel structure may include a photoelectric conversion element and a pixel transistor referred to as a transfer transistor which are stacked to maximize the fill factor of the photoelectric conversion element. In the 3D pixel structure, the transfer transistor may be formed over the photoelectric conversion element, and the characteristics of the unit pixel 110 may be determined according to the on/off characteristic of the transfer transistor.

The following embodiments provide an image sensor having a 3D pixel structure which includes a transfer transistor with an improved on/off characteristic and a method for fabricating the same.

Figure 2:
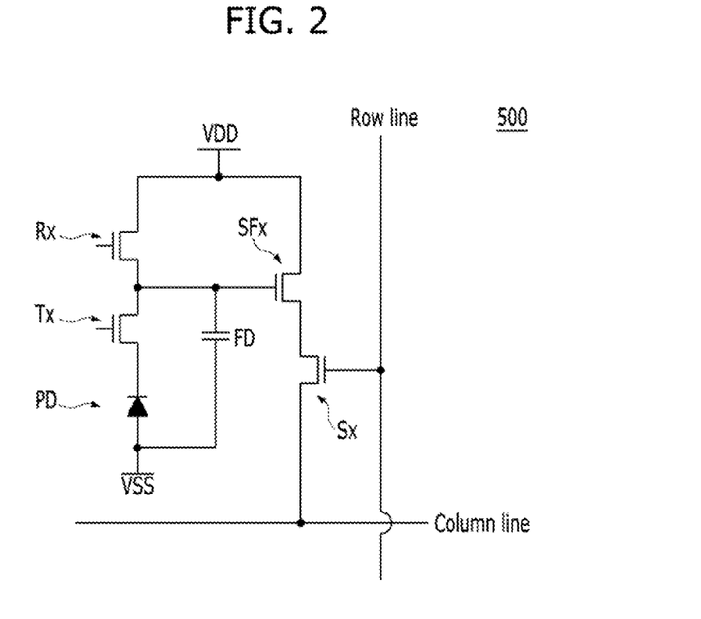
FIG. 2 is an equivalent circuit diagram of a unit pixel of an image sensor, according to a comparative example.
Figure 3:
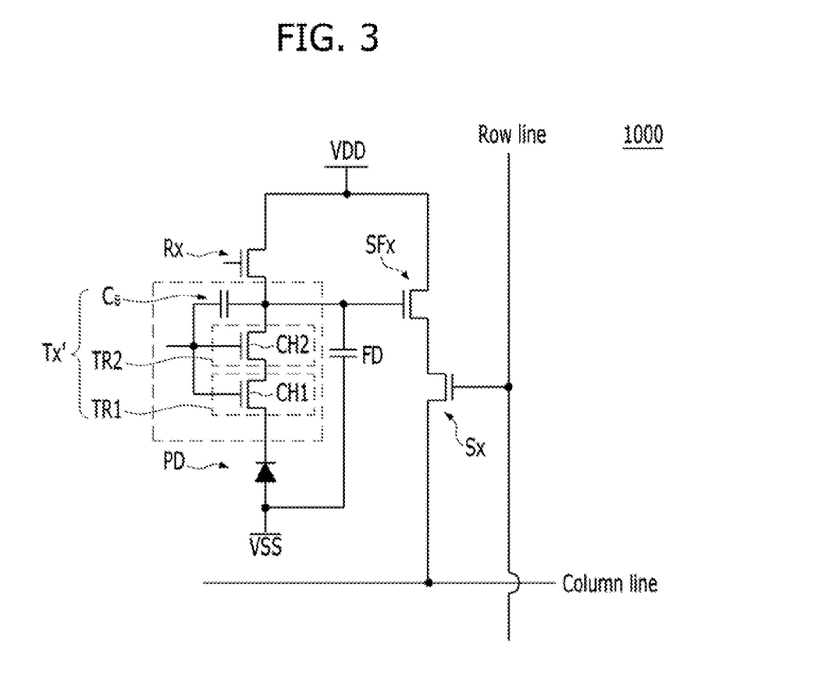
FIG. 3 is an equivalent circuit diagram of a unit pixel of an image sensor, according to an embodiment of the present invention.

FIG. 2 is an equivalent circuit diagram of a unit pixel 500 of an image sensor according to a comparative example. FIG. 3 is an equivalent circuit diagram of a unit pixel 1000 of an image sensor according to an embodiment of the present invention.

First, referring to FIG. 2, the equivalent circuit diagram of the unit pixel 500 according to the comparative example will be described. The unit pixel 500, may include a photoelectric conversion element PD, a transfer transistor Tx, a reset transistor Rx, a source follower transistor SFx and a selection transistor Sx.

The photoelectric conversion element PD may include a photodiode. The photoelectric conversion element PD may be coupled between the transfer transistor Tx and a second node VSS set to a ground voltage. The reset transistor Rx may be coupled between the transfer transistor Tx and a first node VDD set to a supply voltage. A floating diffusion FD may be coupled between the reset transistor Rx and the transfer transistor Tx. The gate of the source follower transistor SFx may be coupled to the floating diffusion FD. One side of the source follower transistor SFx may be coupled to the first node VDD, and the other side of the source follower transistor SFx may be coupled to the selection transistor Sx. The gate of the selection transistor Sx may be coupled to a row line extended from the row driver, and the selection transistor Sx may be coupled to a column line.

Next, the operation of the unit pixel 500 will be described. First, when the selection transistor Sx is turned on in response to a select signal applied through the row line from the row driver, the specific unit pixel may be selected. Then, the reset transistor Rx may be turned on to reset the floating diffusion FD in a state where light incident on the photoelectric conversion element PD is blocked. Then, the reset transistor Rx may be to riled off, and incident light may be irradiated onto the photoelectric conversion element PD during a predetermined time, for example, an integration time, thereby generating a photocharge. After the integration time lapses, the transfer transistor Tx may be turned on to transfer the photocharge generated by the photoelectric conversion element PD to the floating diffusion FD. The transferred photocharge may be stored in the floating diffusion FD. The gate bias of the source follower transistor SFx may be changed in proportion to the photocharge stored in the floating diffusion FD, and an output voltage corresponding to the supply voltage or an image signal may be outputted to the column line in response to the photocharge stored in the floating diffusion FD.

In the pixel unit 500, transfer efficiency may be determined according to the on/off characteristic of the transfer transistor Tx, the transfer efficiency indicating the efficiency in which the photocharge generated through the photoelectric conversion element PD is transferred to the floating diffusion FD. As the transfer efficiency is increased, the characteristic of the unit pixel can be improved. For example, with the increase of the transfer efficiency, a difference between an image reset signal and an image signal which are inputted to the CDS 120 of FIG. 1 may be increased to improve the quality of an image.

Next, referring to FIG. 3, the equivalent circuit diagram of the unit pixel 1000, according to an embodiment of the present invention, will be described. The unit pixel 1000, according to the illustrated embodiment of FIG. 3, may include a photoelectric conversion element PD, a transfer transistor Tx', a reset transistor Rx, a source follower transistor SFx and a selection transistor Sx. The unit pixel 1000 may be operated, generally, in the same manner as the pixel unit 500 of FIG.

However, the transfer transistor Tx' of the unit pixel 1000 according to the present embodiment has a different configuration from the transfer transistor Tx of the unit pixel 500 according to the comparative example. Specifically, the transfer transistor Tx' may include first and second transistors TR1 and TR2 which are coupled in series to each other. The first and second transistors TR1 and TR2 may have different threshold voltages. Furthermore, the transfer transistor Tx' according to the present embodiment may include a boosting capacitor $C_B$. One terminal of the boosting capacitor $C_B$ is coupled to the gate of the first transistor TR1 and the gate of the second transistor TR2 and the other terminal is coupled to the floating diffusion FD.

The gates of the first and second transistors TR1 and TR2 may be coupled to receive the same transfer signal. The first and second transistors TR1 and TR2 may be of the same conductivity type. The first and second transistors TR1 and TR2 may be N-type transistors. The first and second transistors TR1 and TR2 may include channels CH1 and CH2 with different conductivity types so that the first and second transistors TR1 and TR2 may have different threshold voltages. Specifically, the first transistor TR1 which is coupled between the photoelectric conversion element PD and the second transistor TR2 may include a P-type first channel layer CH1. The first transistor TR1 may be operated in an enhancement mode. On the other hand, the second transistor TR2 coupled between the first transistor TR1 and the reset transistor Rx may include the intrinsic or N-type second channel layer CH2. The second transistor TR2 may be operated in the enhancement mode or depletion mode. The second transistor may be provided in the form of a thin film transistor. Thus, according to the transfer signal applied to the gates of the first and second transistors TR1 and TR2, that is, the transfer gates, both of the two transistors may be controlled to have the on or off state, or only one of the two transistors may be controlled to have the on or off state. That is, the plurality of transistors may be used to control the on/off of the transfer transistor Tx', thereby improving the on/off characteristic. Thus, the transfer efficiency of the transfer transistor Tx' may be improved.

The boosting capacitor $C_B$ may include a parasitic capacitor formed between the gate of the second transistor TR2 and the drain of the second transistor TR2, that is, the floating diffusion FD. When the transfer signal is applied to the first and second transistors TR1 and TR2 to transfer the photo charge generated by the photoelectric conversion element PD to the reset floating diffusion FD or the floating diffusion FD set to a reference voltage or supply voltage, the boosting capacitor $C_B$ may increase the potential of the floating diffusion FD due to a coupling caused by the transfer signal applied to the transfer gates. Thus, a potential difference between the first and second transistors TR1 and TR2 coupled in series, that is, the photoelectric conversion elements PD and the floating diffusion FD may be increased to further improve the transfer efficiency of the transfer transistor Tx'.

In the above-described embodiment, the case in which the first and second transistors TR1 and TR2 are N-type transistors has been taken as an example, but the present invention is not limited thereto. That is, the first and second transistors TR1 and TR2 may be P-type transistors. In this case, the first channel layer may have the N-type conductivity, and the second channel layer may have the intrinsic or P-type conductivity.

Hereinafter, the structure of the transfer transistor which can be implemented within a limited area and includes the first and second transistors and the boosting capacitor will be described in detail with reference to the accompanying drawings.

Figure 4:
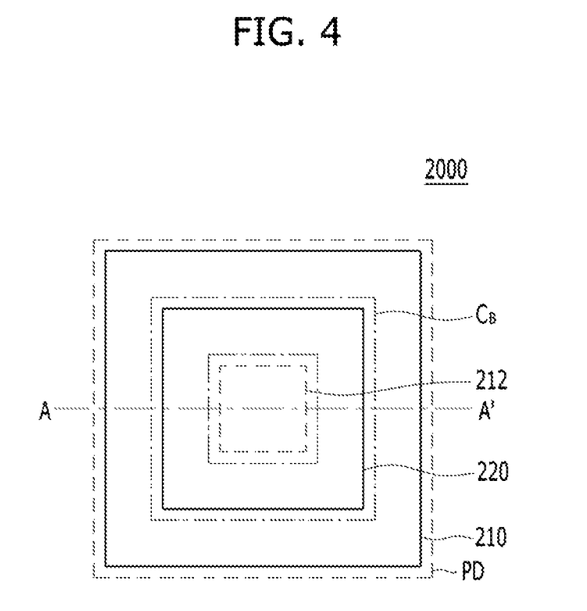
FIG. 4 is a plan view of an image sensor including a transfer transistor, according to an embodiment of the present invention.
Figure 5:
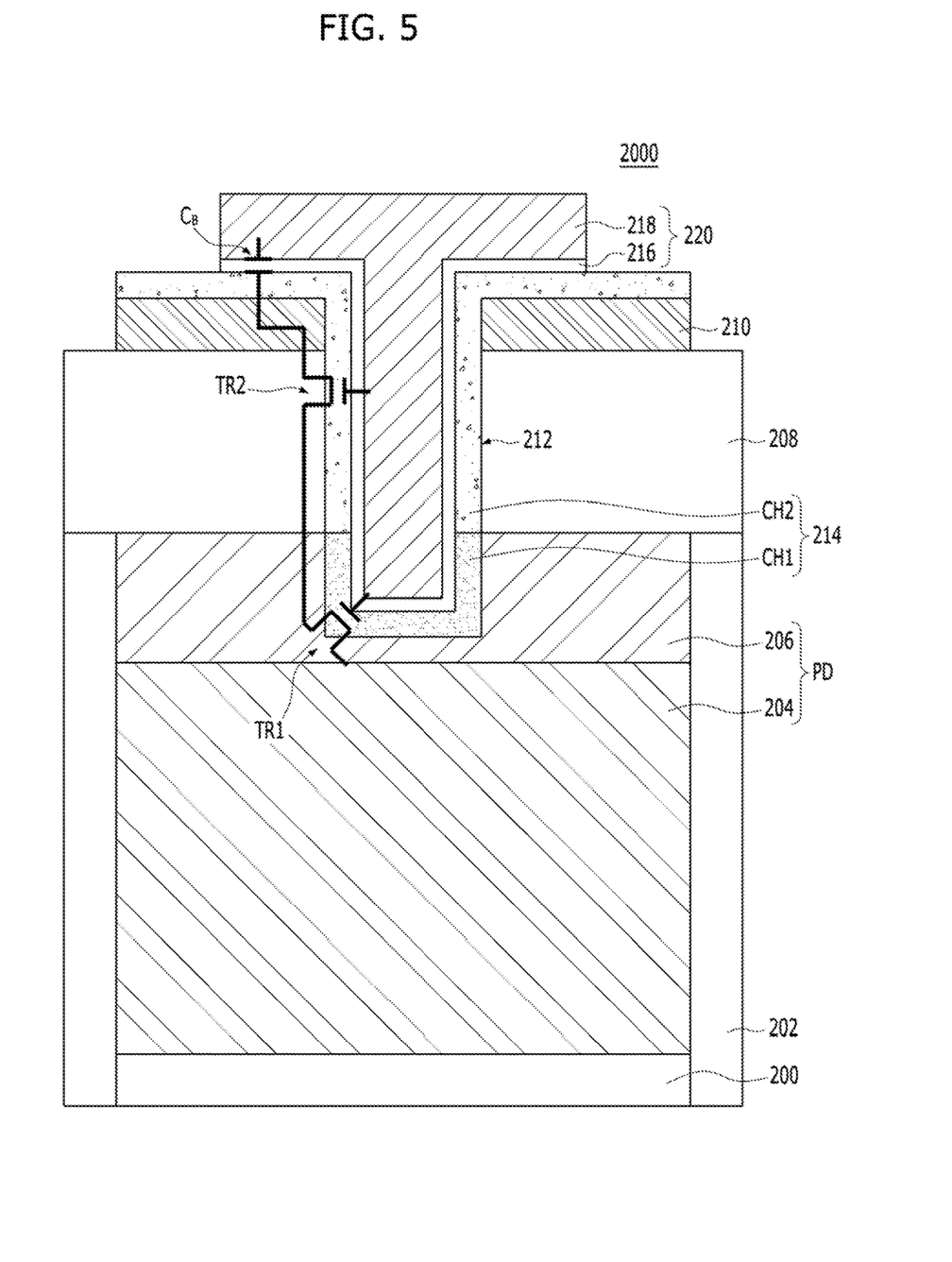
FIG. 5 is a cross-sectional, side view taken along line A-A' of FIG. 4.

FIG. 4 is a plan view illustrating an image sensor 2000 including a transfer transistor, according to an embodiment of the present invention. FIG. 5 is a cross-sectional view taken along line A-A', of FIG. 4.

As illustrated in FIGS. 4 and 5, the image sensor 2000 according to the present embodiment may include a photoelectric conversion element PD and an isolation structure 202. The photoelectric conversion element PD may have a structure in which first and second conductive layers 204 and 206 are stacked, and the isolation structure 202 may be formed in a substrate 200 to isolate the neighboring photoelectric conversion elements PD.

The photoelectric conversion element PD may include a photodiode. For example, the photoelectric conversion element PD may include a first conductive layer 204 and a second conductive layer 206 formed over the first conductive layer 204. The second conductive layer 206 may have a different conductivity type from the first conductive layer 204. For example, the first conductive layer 204 may have the N-type conductivity, and the second conductive layer 206 may have the P-type conductivity. The first and second conductive layers 204 and 206 may include an impurity region formed by ion-implanting an impurity into the substrate 200 or an epitaxial layer doped with a predetermined impurity. The epitaxial layer may include a silicon-epitaxial layer. Thus, the first conductive layer 204 may include an N-type impurity region formed in the substrate 200 or an N-type silicon-epitaxial layer formed on the substrate 200. The second conductive layer 206 may include a P-type impurity region formed in the substrate 200 or a P-type silicon-epitaxial layer formed on the substrate 200. The first conductive layer 204 may serve as a junction region of the transfer transistor Tx', or particularly a junction region of the first transistor TR1. For reference, the junction region may indicate a source region or drain region.

The substrate 200 may include a semiconductor substrate. The semiconductor substrate may have a single crystal state, and include a silicon-containing material. That is the substrate 200 may include a single-crystal silicon-containing material. The substrate 200 may include a substrate thinned through a thinning process. For example, the substrate 200 may include a bulk silicon substrate thinned through a thinning process.

The isolation structure 202 may include an STI (Shallow Trench Isolation), DTI (Deep Trench Isolation) or impurity region. The impurity region may be formed by ion-implanting an impurity into the substrate 200. For example, the impurity region may include a P-type impurity region formed by ion-implanting a P-type impurity, for example, boron (B) into the substrate 200. The isolation structure 202 may include any one of STI, DTI and impurity regions or combinations of two or more thereof. For example, the isolation structure 202 which surrounds the photoelectric conversion element PD and isolates the neighboring photoelectric conversion elements PD may include the DTI region or a combination of the DTI region and the impurity region.

The image sensor 2000 may include an insulating layer 208, a third conductive layer 210 (also referred to as an upper conductive layer) and an opening 212. The insulating layer 208 may be formed over the photoelectric conversion element PD, and the third conductive layer 210 may be formed over the insulating layer 208. The opening 212 may expose the second conductive layer 206 through the third conductive layer 210 and the insulating layer 208.

The insulating layer 208 may serve to separate the photoelectric conversion element PD and the third conductive layer 210 from each other. The insulating layer 208 may provide a channel length required by the transfer transistor Tx', or particularly a channel length required by the second transistor TR2. The channel length of the second transistor TR2 may be controlled through a method of adjusting the thickness of the insulating layer 208. The insulating layer 208 may include any one selected from the group consisting of oxide, nitride, and oxynitride or combinations of two or more thereof.

The third conductive layer 210 may serve as a junction region of the transfer transistor Tx', or particularly a junction region of the second transistor TR2. The third conductive layer 210 may serve as a floating diffusion FD. The third conductive layer 210 may serve as an electrode of the boosting capacitor $C_B$ of the transfer transistor Tx. The third conductive layer 210 may be formed in a plate shape, and have an area corresponding to the photoelectric conversion element PD. This is in order to provide a floating diffusion FD with sufficient capacitance. The third conductive layer 210 may have the same conductivity type as the first conductive layer 204. For example, the third conductive layer 210 may have the N-type conductivity. The third conductive layer 210 may include a semiconductor material or metallic material. For example, the third conductive layer 210 may include a silicon containing material, and the silicon containing material may include single-crystal silicon or polysilicon. For reference, the single-crystal silicon may include a silicon epitaxial layer.

The opening 212 may provide a space in which a channel layer 214 and a transfer gate 220 of the transfer transistor Tx are to be formed. The plan shape of the opening 212 may be set to a circular shape, elliptical shape or polygonal shape having an equal or more number of sides to or than a triangle. The opening 212 may be formed through the third conductive layer 210 and the insulating layer 208 and may continue into the second conductive layer with the bottom surface of the opening 212 and the sidewalls of the lower portion of the opening 212 being in contact with the second conductive layer 206. For example, as shown in FIG. 5, the bottom surface of the opening 212 may be more adjacent to the interface between the first conductive layer 204 and the second conductive layer 206 than the interface between the second conductive layer 206 and the insulating layer 208. This configuration may improve the operation characteristics of the first transistor TR1. In the present embodiment, the case in which one opening 212 is formed has been taken as an example, but the present invention is not limited thereto. That is, a plurality of openings 212 may be formed.

The image sensor 2000 may include a channel layer 214 and a transfer gate 220. The channel layer 214 may be formed to conform along the internal surface of the opening 212. The transfer gate 220 may be formed on the channel layer 214 to fill the opening 212. The transfer gate 220 may be partially formed over the third conductive layer 210 to partially overlap the third conductive layer 210.

The channel layer 214 may include first and second channel layers CH1 and CH2 which are coupled to each other while having different conductivity types. Since the second channel layer CH2 has a different conductivity type from the first channel layer CH1, the first and second transistors TR1 and TR2 may have different threshold voltages from each other. The channel layer 214 may have a constant thickness along the surface of the resultant structure. The channel layer 214 may include a silicon containing material. The silicon containing material may include polysilicon. For example, the channel layer 214 may include intrinsic polysilicon, P-type polysilicon doped with a P-type impurity such as B, or N-type polysilicon doped with an N-type impurity such as phosphorous (P) or arsenic (As). The intrinsic polysilicon may include undoped polysilicon. Furthermore, the intrinsic polysilicon may also include doped polysilicon which has the same electrical state as undoped polysilicon.

In the channel layer 214, the first channel layer CH1 may be formed along the surface of the opening 212 which is in contact with the second conductive layer 206. That is, the first channel layer CH1 may be in contact with the second conductive layer 206. The first channel layer CH1 may have the same conductivity type as the second conductive layer 206. For example the first channel layer CH1 may have the P-type conductivity. Thus, the first channel layer CH1 may include P-type polysilicon. The first transistor TR1 having the first channel layer CH1 may be operated in the enhancement mode. The magnitude of the threshold voltage required by the first transistor TR1 may be adjusted according to the impurity doping concentration of the first channel layer CH1.

In the channel layer 214, the second channel layer CH2 may be in contact with the sidewalls of the insulating layer 208, the sidewalls of the third conductive layer 210 and the top surface of the third conductive layer 210. The second channel layer CH2 may have a different conductivity type from the first channel layer CH1. For example, the second channel layer CH2 may have the intrinsic or N-type conductivity. Thus, the second channel layer CH2 may include intrinsic polysilicon or N-type polysilicon. Specifically, when the second channel layer CH2 includes intrinsic polysilicon, the second transistor TR2 may be operated in the enhancement mode in which the second channel layer CH2 maintains an inactive state while the second transistor TR2 is turned off. On the other hand, when the second channel layer CH2 includes N-type polysilicon, the second transistor TR2 may be operated in the depletion mode in which the second channel layer CH2 maintains an active state while the second transistor TR2 is turned off.

The transfer gate 220 may include a gate dielectric layer 216 and a gate electrode 218. The gate dielectric layer 216 may be formed on the channel layer 214, and have a constant thickness along the surface of the structure. The gate dielectric layer 216 may serve as a dielectric layer of the boosting capacitor $C_B$. The gate dielectric layer 216 may include any one selected from the group consisting of oxide, nitride and oxynitride or combinations of two or more thereof.

The gate electrode 218 may be formed on the gate dielectric layer 216 to fill the opening 212. A part of the gate electrode 218 may be formed over the third conductive layer 210. The gate electrode 218 may have a T-shaped structure partially or completely overlapping the third conductive layer 210. The plan shape of the gate electrode 218 formed over the opening 212 may be set to a circular shape, elliptical shape or polygonal shape having an equal or more number of sides to or than a triangle. The plan shape of the gate electrode 218 may correspond to the plan shape of the opening 212. The gate electrode 218 may include a semiconductor material. The gate electrode 218 may include a metallic material. Since the gate electrode 218 is buried in the opening 212, the first and second transistors TR1 and TR2 may share the gate electrode 218. The gate electrode 218 and the third conductive layer 210 may serve as an electrode of the boosting capacitor $C_B$. Specifically, the region in which the third conductive layer 210 and the transfer gate 220 vertically overlap each other may serve as the boosting capacitor $C_B$. That is, the boosting capacitor $C_B$ may include a capacitor having a structure in which the third conductive layer 210 the gate dielectric layer 216 and the gate electrode 218 are stacked. The capacitor may indicate a parasitic capacitor formed between the transfer gate 220 and the junction region or the third conductive layer 210 in the transfer transistor. The capacitance of the boosting capacitor $C_B$ may be adjusted according to the overlapping area between the third conductive layer 210 and the transfer gate 220. As such, the present embodiment can provide the boosting capacitor $C_B$ which is capable of improving the transfer efficiency of the transfer transistor Tx using the parasitic capacitor formed in the region where the third conductive layer 210 and the transfer gate 220 overlap each other, without an additional process and an additional area.

Although not illustrated, the image sensor according to the present embodiment may include a color separation element formed on the incident surface of the substrate 200 and a light focusing element formed over the color separation element. The color separation element may include a color filter, and the color filter may include a red filter, a green filter, a blue filter, a cyan filter, a yellow filter, a magenta filter, a white filter, a black filter and an IR cutoff filter. The light focusing element may include a digital lens or hemispherical lens.

FIGS. 6A to 6D are cross-sectional views illustrating a method for fabricating an image sensor including a transfer transistor according to an embodiment of the present invention.

Figure 6A:
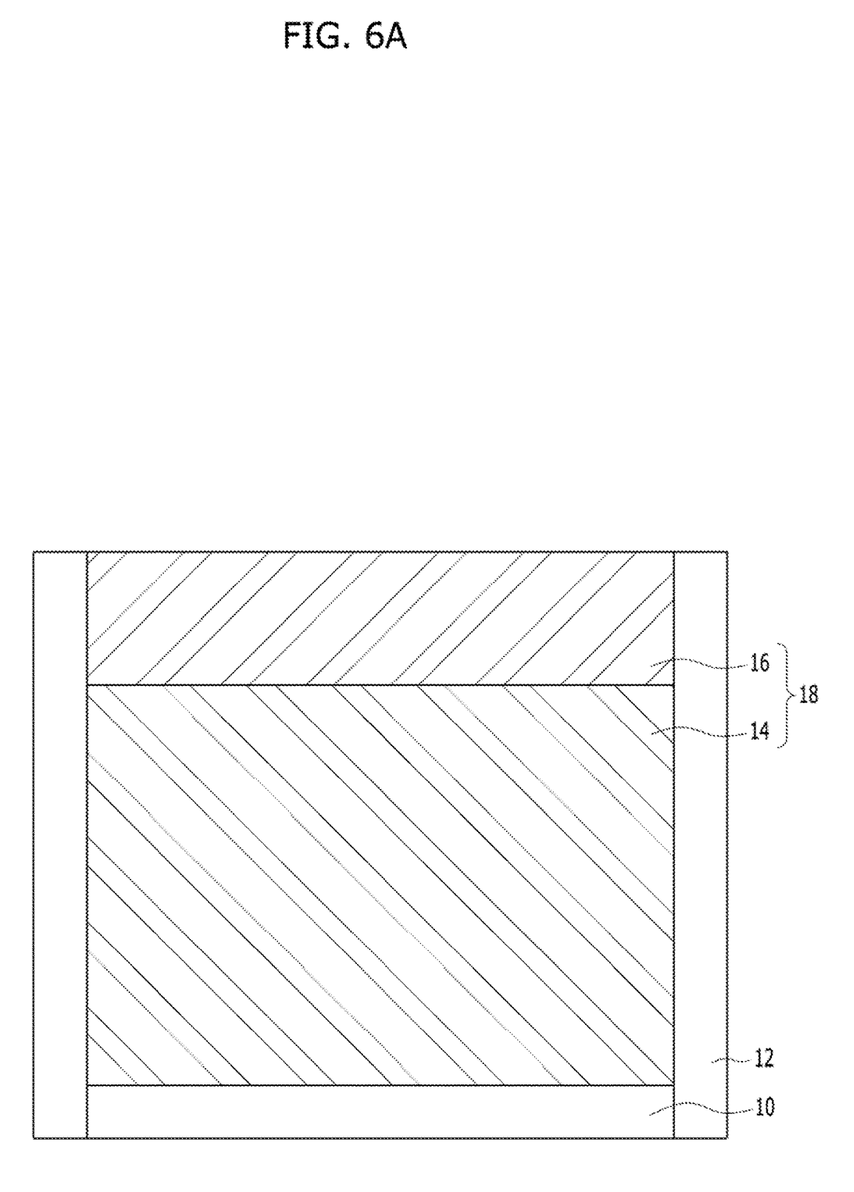
FIGS. 6A to 6D are cross-sectional, side views illustrating a method for fabricating an image sensor including a transfer transistor, according to an embodiment of the present invention.

As illustrated in FIG. 6A, an isolation structure 12 may be formed in a substrate 10, the isolation structure 12 defining unit pixel regions. The substrate 10 may include a semiconductor substrate. The semiconductor substrate may be or include, for example, a silicon containing material. For example, the substrate 10 may include a bulk silicon substrate.

The isolation structure 12 may be or include an STI, DTI or impurity region. The impurity region may be formed by ion-implanting an impurity, for example, a P-type impurity into the substrate 10. The isolation structure 12 may include any one of the STI, DTI and impurity regions or combinations of two or more thereof.

Then, a photoelectric conversion element 18 may be formed. The photoelectric conversion element 18 may include a photodiode. For example, the photoelectric conversion element 18 may include first and second conductive layers 14 and 16 having different conductivity types. The first conductive layer 14 may have the N-type conductivity, and the second conductive layer 16 may have the P-type conductivity.

The first and second conductive layers 14 and 16 may be formed by ion-implanting a predetermined impurity into the substrate 10. The first and second conductive layers 14 and 16 may include a conductive layer formed by doping the substrate 10 with predetermined impurity, for example, an epitaxial layer. Thus, the first conductive layer 14 may include an N-type impurity region or N-type silicon epitaxial layer, and the second conductive layer 16 may include a P-type impurity region or P-type silicon epitaxial layer.

Figure 6B:
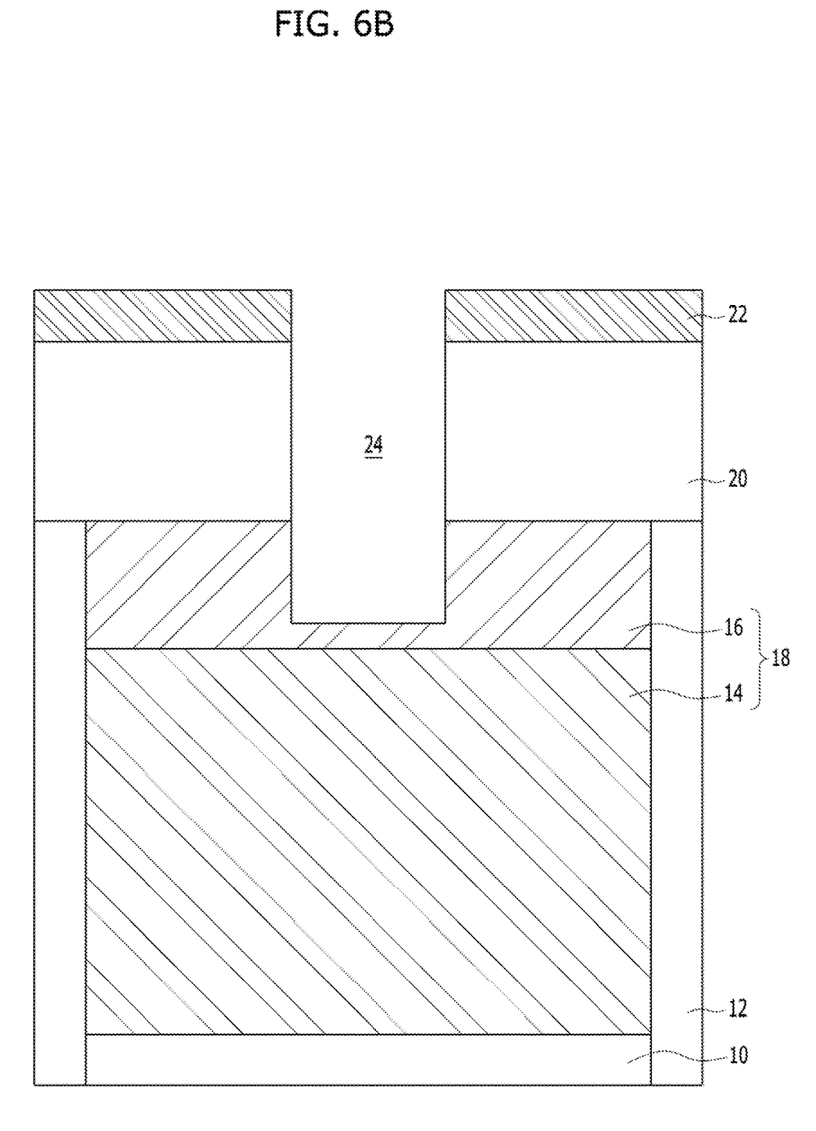

As illustrated in FIG. 6B an insulating layer 20 may be formed over the photoelectric conversion element 18. The insulating layer 20 may, for example, be or include any insulating material selected from the group consisting of oxide, nitride, and oxynitride or combinations of two or more thereof.

Then, a third conductive layer 22 may be formed over the insulating layer 20. The third conductive layer 22 may have the same conductivity type as the first conductive layer 14. Thus, the third conductive layer 22 may have the N-type conductivity. The third conductive layer 22 may include a semiconductor material or a metallic material. For example, the third conductive layer 22 may include a silicon containing material, and the silicon containing material may include single-crystal silicon or polysilicon. For reference, the single-crystal silicon nay include a silicon epitaxial layer.

Then, a mask pattern (not illustrated) may be formed over the third conductive layer 22, and an opening 24 may be formed by etching the third conductive layer 22, the insulating layer 20 and partially the second conductive layer 16 using the mask pattern as an etch barrier. The etching process for forming the opening 24 may include a dry etching process. The etching process for forming the opening 24 may include a series of processes of forming a hole through the third conductive layer 22 and the insulating layer 20 and etching a part of the second conductive layer 16 such that the bottom surface of the opening 24 is more adjacent to the interface between the first conductive layer 14 and the second conductive layer 16 more than the interface between the second conductive layer 16 and the insulating layer 20.

Figure 6C:
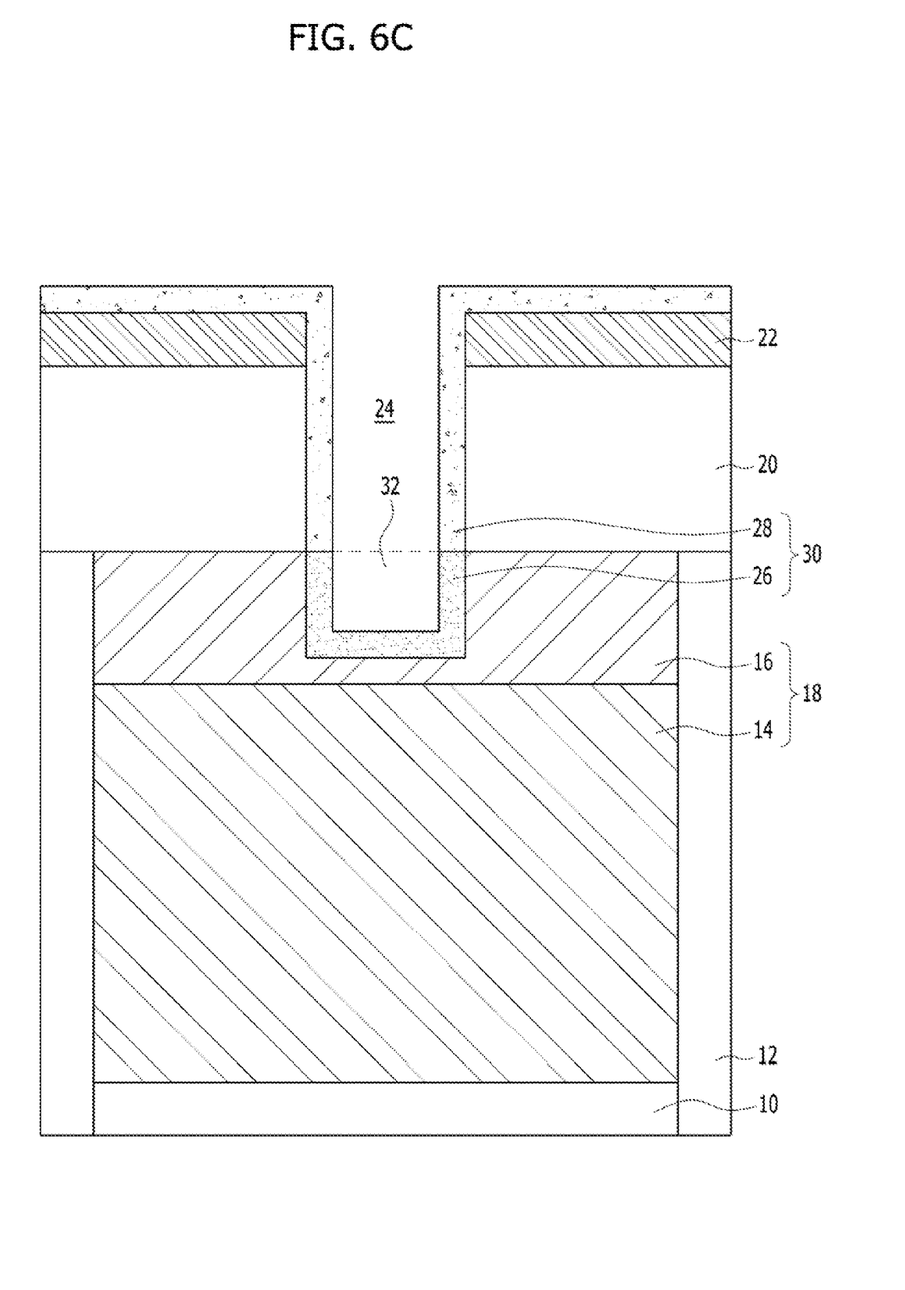

As illustrated in FIG. 6C, a channel layer 30 may be formed along the surface of the resultant structure including the opening 24. The channel layer 30 may have a constant thickness along the surface of the resultant structure including the opening 24. The channel layer 30 may include first and second channel layers 26 and 28 which are coupled to each other while having different conductivity types. The channel layer 30 may include a silicon containing material. The silicon containing material may include polysilicon. For example, the channel layer 30 may include intrinsic polysilicon, P-type polysilicon doped with a P-type impurity such as B, or N-type polysilicon doped with an N-type impurity such as P or As. Specifically, the first channel layer 26 may include P-type polysilicon, and the second channel layer 28 may include intrinsic polysilicon or N-type polysilicon.

The channel layer 30 including the first and second channel layers 26 and 28 may form a pre-channel layer along the surface of the resultant structure including the opening 24 the pre-channel layer having a characteristic required by the first channel layer 26. For example, the pre-channel layer may have the same conductivity type as the first channel layer 26. The pre-channel layer may be formed of P-type polysilicon. Then, a victim layer 32 may be formed on the pre-channel layer to fill the lower region of the opening 24. The lower region of the opening 24 may indicate the opening 24 formed in the second conductive layer 16. Then, counter doping may be performed on the pre-channel layer exposed by the victim layer 32 such that the second channel layer 28 has a required characteristic. For example, the counter doping may be performed in such a manner that the exposed pre-channel layer has the intrinsic or N-type conductivity. Then, a channel layer 30 may be formed through a series of processes of removing the victim layer 32.

In another embodiment, the channel layer 30 including the first and second channel layers 26 and 28 may form a pre-channel layer along the surface of the resultant structure including the opening 24. At this time, the pre-channel layer may be formed of intrinsic polysilicon, for example, undoped polysilicon. Then, an anneal process may be performed to diffuse the impurity of the second conductive layer 16 or the P-type impurity into the pre-channel layer which is in contact with the second conductive layer 16, thereby forming the first channel layer 26. At this time, when the second channel layer 28 includes intrinsic polysilicon, an anneal process may be performed to form the channel layer 30. On the other hand, when the second channel layer 28 includes N-type polysilicon, a victim layer 32 may be formed over the pre-channel layer to cover the first channel layer 26 and the second channel layer 28 may be formed by performing an impurity doping process on the pre-channel layer exposed by the victim layer 32. Then, the channel layer 30 may be formed through a series of processes of removing the victim layer 32.

Figure 6D:
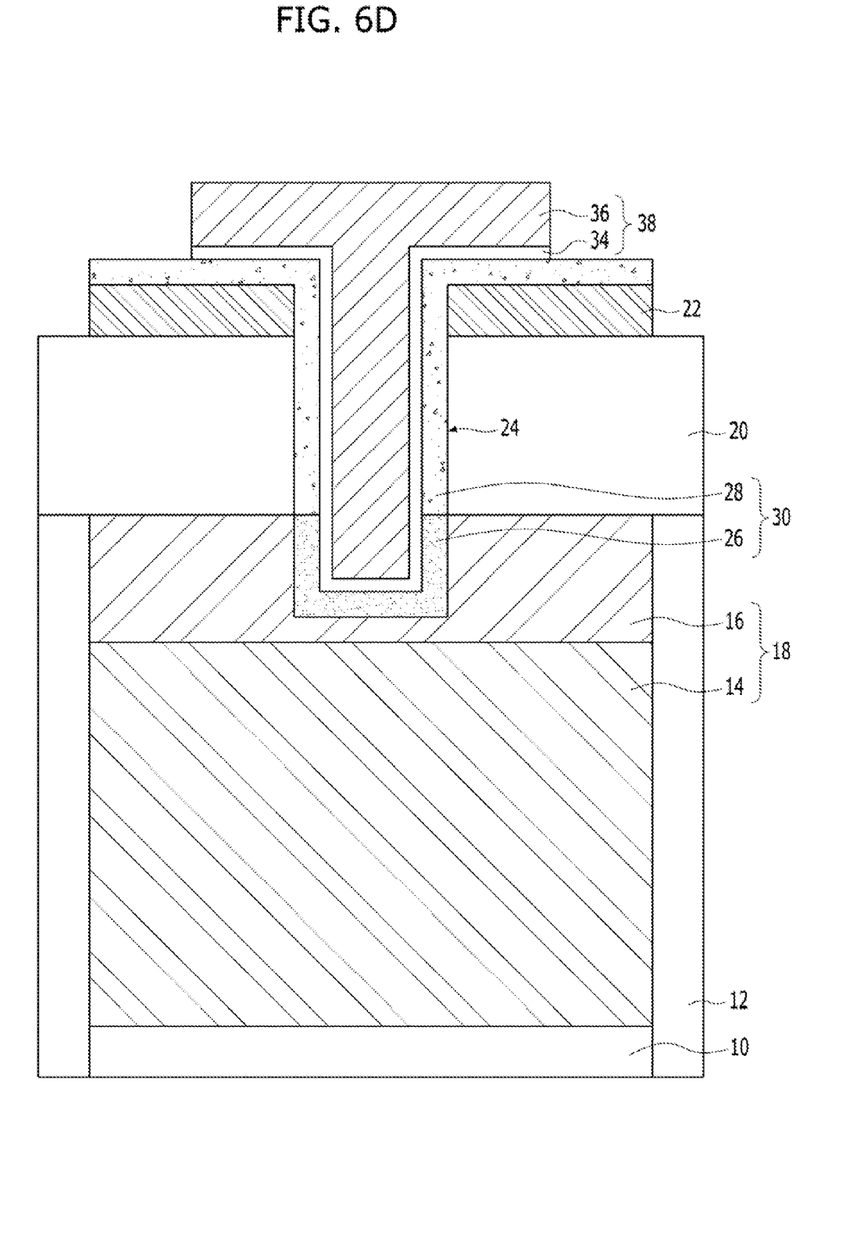

As illustrated in FIG. 6D, a transfer gate 38 may be formed over the channel layer 30, the transfer gate 38 having a stacked structure of a gate dielectric layer 34 and a gate electrode 36. The transfer gate 38 may have a T-shaped structure which the opening 24 and partially overlaps the third conductive layer 22. The gate dielectric layer 34 may include any material selected from the group consisting of oxide, nitride and oxynitride or combinations of two or more thereof. The gate electrode 36 may include a semiconductor material or a metallic material.

Then, a mask pattern (not illustrated) may be formed over the resultant structure including the transfer gate 38, and the third conductive layer 22 may be etched to have an area corresponding (i.e., coextensive) to the photoelectric conversion element 18. Thus, the third conductive layer 22 between neighboring unit pixels can be separated.

After the third conductive layer 22 is etched, the third insulating layer 20 may be etched using a mask pattern as an etch barrier for making the outer perimeter of the third conductive layer to correspond to the outer perimeter of the isolation layer 12.

Then, the image sensor can be completed through one or more well-known methods.

The image sensor according to an embodiment of the present invention may be used in various electronic devices or systems. Hereinafter, a camera including an image sensor according to an embodiment of the present invention will be described with reference to FIG. 7.

Figure 7:
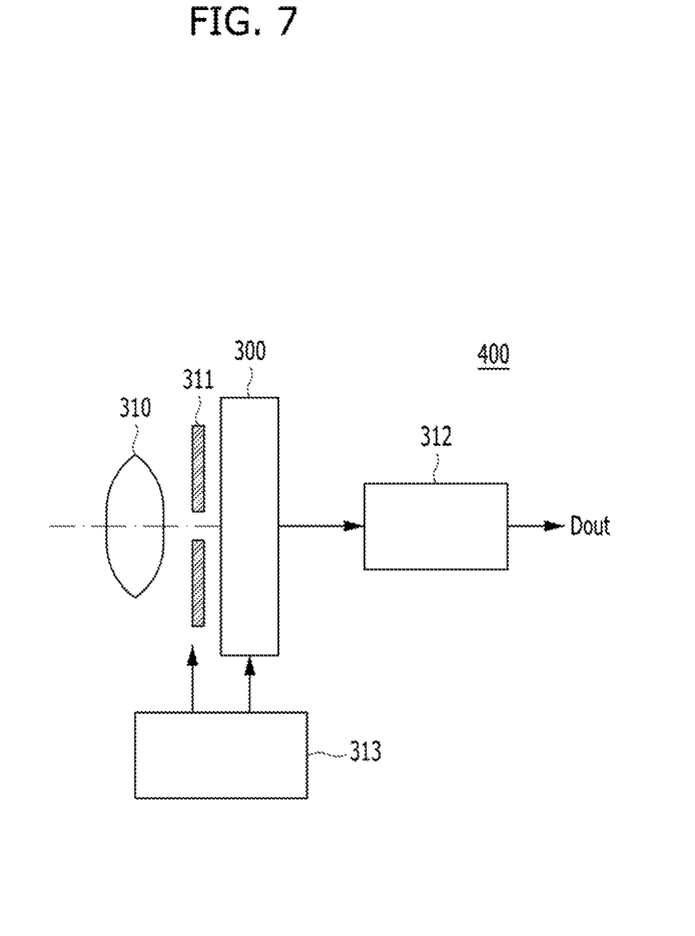
FIG. 7 is a diagram schematically illustrating an electronic device including an image sensor, according to an embodiment of the present invention.

FIG. 7 is a diagram schematically illustrating an electronic device 400 including an image sensor shown in FIG. 1. Referring to FIG. 7 the electronic device 400 including the image sensor according to an embodiment of the present invention may be a camera capable of taking a still image or a moving image. The electronic device 400 may include an optical system or optical lens 310, a shutter unit 311, a driving unit 313, and a signal processing unit 312. The driving unit 313 may control/drive the image sensor 300 and the shutter unit 311.

The optical system 310 may guide image light from an object to the pixel array 100 of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

According to the present embodiments, the transfer transistor may include the plurality of transistors having different threshold voltages, thereby improving the transfer efficiency.

Furthermore, since the transfer transistor uses a parasitic capacitor as the boosting capacitor, the transfer efficiency of the transfer transistor may be further improved.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a photoelectric conversion element comprising a first doped semiconductor layer, and a second doped semiconductor layer formed over a first doped semiconductor layer;
   an insulating layer formed over the second doped semiconductor layer;
   a third doped semiconductor layer formed over the insulating layer;
   an opening formed in the second doped semiconductor layer through the third doped semiconductor layer and the insulating layer;
   a channel layer formed along the surface of the opening, and comprising first and second channel layers which are coupled to each other while having different conductivity types;
   a gate dielectric layer; and
   a transfer gate formed over the channel layer so as to fill the opening, and partially formed over the third doped semiconductor layer, wherein the first channel layer is in direct contact with the second doped semiconductor layer; and
   wherein the first doped semiconductor has a different conductivity type from the second doped semiconductor layer, and the third doped semiconductor layer has the same conductivity type as the second conductive doped semiconductor layer.

2. The image sensor of claim 1, further comprising a boosting capacitor which includes the third doped semiconductor layer and the transfer gate formed over the third doped semiconductor layer to overlap the third doped semiconductor layer.

3. The image sensor of claim 1, wherein the first channel layer is in contact with the second doped semiconductor layer, and the second channel layer is in contact with the insulating layer and the third doped semiconductor layer.

4. The image sensor of claim 1, wherein the first channel layer has the same conductivity type as the second doped semiconductor layer.

5. The image sensor of claim 1, wherein the first and second channel layers include the same material.

6. The image sensor of claim 1, wherein the first channel layer comprises P-type polysilicon.

7. The image sensor of claim 1, wherein the second channel layer comprises intrinsic polysilicon or N-type polysilicon.

8. The image sensor of claim 1, wherein the bottom surface of the opening is more adjacent to the interface between the first doped semiconductor layer and the second doped semiconductor layer than the interface between the insulating layer and the second doped semiconductor layer.

9. The image sensor of claim 1, wherein the third doped semiconductor layer is formed in a plate shape, and has an area corresponding to the photoelectric conversion element.

10. The image sensor of claim 1, wherein the first doped semiconductor layer has a different conductivity type from the second doped semiconductor layer, and the third doped semiconductor layer has the same conductivity type as the second doped semiconductor layer.

11. The image sensor of claim 1, wherein the first and second conductive layers comprise an impurity region formed in a substrate or an epitaxial layer formed over the substrate.

12. The image sensor of claimed 1, wherein the first channel layer is formed between the second doped semiconductor layer and the transfer gate.

13. The image sensor of claim 1, wherein the second channel layer is formed over the first channel layer and covers an upper surface of the third doped semiconductor layer.

14. The image sensor of claim 1, wherein the first doped semiconductor layer and the third doped semiconductor layer serves as a junction region.

15. The image sensor of claim 1, wherein the first channel layer is formed along a bottom surface and a sidewall surface of the opening formed in the second doped semiconductor layer.

* * * * *